(12) United States Patent
Chang et al.

(10) Patent No.: US 12,068,262 B2
(45) Date of Patent: Aug. 20, 2024

(54) SEMICONDUCTOR PACKAGE INCLUDING NEIGHBORING DIE CONTACT AND SEAL RING STRUCTURES, AND METHODS FOR FORMING THE SAME

(71) Applicant: Taiwan Semiconductor Manufacturing Company Limited, Hsinchu (TW)

(72) Inventors: Jen-Yuan Chang, Hsinchu (TW); Chia-Ping Lai, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 487 days.

(21) Appl. No.: 17/474,327

(22) Filed: Sep. 14, 2021

(65) Prior Publication Data

US 2022/0302050 A1    Sep. 22, 2022

Related U.S. Application Data

(60) Provisional application No. 63/162,974, filed on Mar. 18, 2021.

(51) Int. Cl.
| | |
|---|---|
| *H01L 23/58* | (2006.01) |
| *H01L 23/00* | (2006.01) |
| *H01L 23/31* | (2006.01) |
| *H01L 23/48* | (2006.01) |
| *H01L 25/065* | (2023.01) |

(52) U.S. Cl.
CPC ........ *H01L 23/585* (2013.01); *H01L 23/3135* (2013.01); *H01L 23/481* (2013.01); *H01L 24/05* (2013.01); *H01L 24/08* (2013.01); *H01L 24/32* (2013.01); *H01L 25/0657* (2013.01); *H01L 24/83* (2013.01); *H01L 25/0652* (2013.01); *H01L 2224/08145* (2013.01); *H01L 2224/32225* (2013.01); *H01L 2224/80001* (2013.01); *H01L 2225/06541* (2013.01)

(58) Field of Classification Search
None
See application file for complete search history.

(56) References Cited

U.S. PATENT DOCUMENTS

11,682,626 B2 * 6/2023 Yu ................. H01L 25/0655
                                              257/706
11,837,586 B2 * 12/2023 Chang ............ H01L 25/50
(Continued)

*Primary Examiner* — Telly D Green
(74) *Attorney, Agent, or Firm* — The Marbury Law Group, PLLC (57) ABSTRACT

A semiconductor package includes: a first die; a second die stacked on an upper surface of the first die, the second die including a second semiconductor substrate and a second seal ring structure that extends along a perimeter of the second semiconductor substrate; a third die stacked on the upper surface of the first die, the third die including a third semiconductor substrate and a third seal ring structure that extends along a perimeter of the third semiconductor substrate; and a connection circuit that extends through the second seal ring structure and the third seal ring structure, in a lateral direction perpendicular to the stacking direction of the first die and the second die, to electrically connect the second semiconductor substrate and the third semiconductor substrate.

20 Claims, 6 Drawing Sheets

(56) References Cited

U.S. PATENT DOCUMENTS

2013/0087891 A1* 4/2013 Kang .................... H01L 23/585
                                                      257/E23.179
2022/0262695 A1* 8/2022 Chang ................... H01L 21/568
2022/0278083 A1* 9/2022 Chang ................... H01L 21/565
2024/0038741 A1* 2/2024 Chang ................. H01L 21/4853

* cited by examiner

SEMICONDUCTOR PACKAGE INCLUDING NEIGHBORING DIE CONTACT AND SEAL RING STRUCTURES, AND METHODS FOR FORMING THE SAME

RELATED APPLICATIONS

This application claims priority to U.S. Provisional Patent Application No. 63/162,974 entitled "New Structure For Silicon On Integrated Circuit Seal Ring For 3D Fabric Neighboring Die Metal Direct Contact" filed on Mar. 18, 2021, the entire contents of which are hereby incorporated by reference for all purposes.

BACKGROUND

The semiconductor industry has continually grown due to improvements in integration density of various electronic components, e.g., transistors, diodes, resistors, capacitors, etc. For the most part, these improvements in integration density have come from successive reductions in minimum feature size, which allows more components to be integrated into a given area.

In addition to smaller electronic components, improvements to the packaging of components seek to provide smaller packages that occupy less area than previous packages. Examples of the type of packages for semiconductors include quad flat pack (QFP), pin grid array (PGA), ball grid array (BGA), flip chips (FC), three-dimensional integrated circuits (3DICs), wafer level packages (WLPs), package on package (PoP), System on Chip (SoC) or System on Integrated Circuit (SoIC) devices. Some of these three-dimensional devices (e.g., 3DIC, SoC, SoIC) are prepared by placing chips over chips on a semiconductor wafer level. These three-dimensional devices provide improved integration density and other advantages, such as faster speeds and higher bandwidth, because of the decreased length of interconnects between the stacked chips. However, there are many challenges related to three-dimensional devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced, for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

The present disclosure is directed to semiconductor devices, and specifically to semiconductor packages that include a package seal ring configured to protect multiple semiconductor dies included in the semiconductor package. The package seal rings may prevent contaminants from passing through bonding structures to prevent damage to the components of the different semiconductor dies. For example, the package seal ring may be configured to prevent contaminants from diffusing through a bonding structure of the semiconductor package and damaging die components.

Figure 1A:
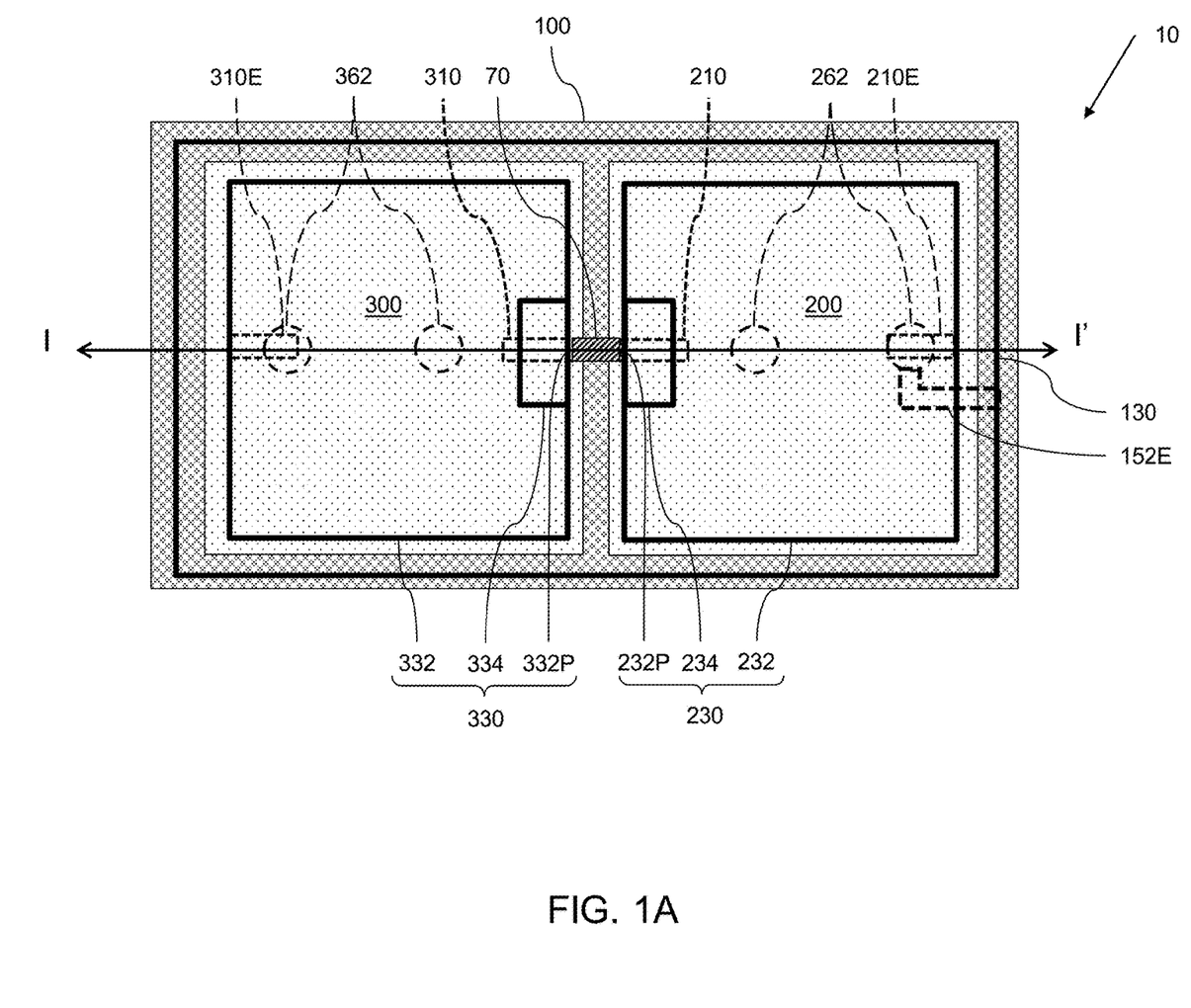
FIG. 1A is a simplified top view of an exemplary semiconductor package according to various embodiments of the present disclosure.
Figure 1B:
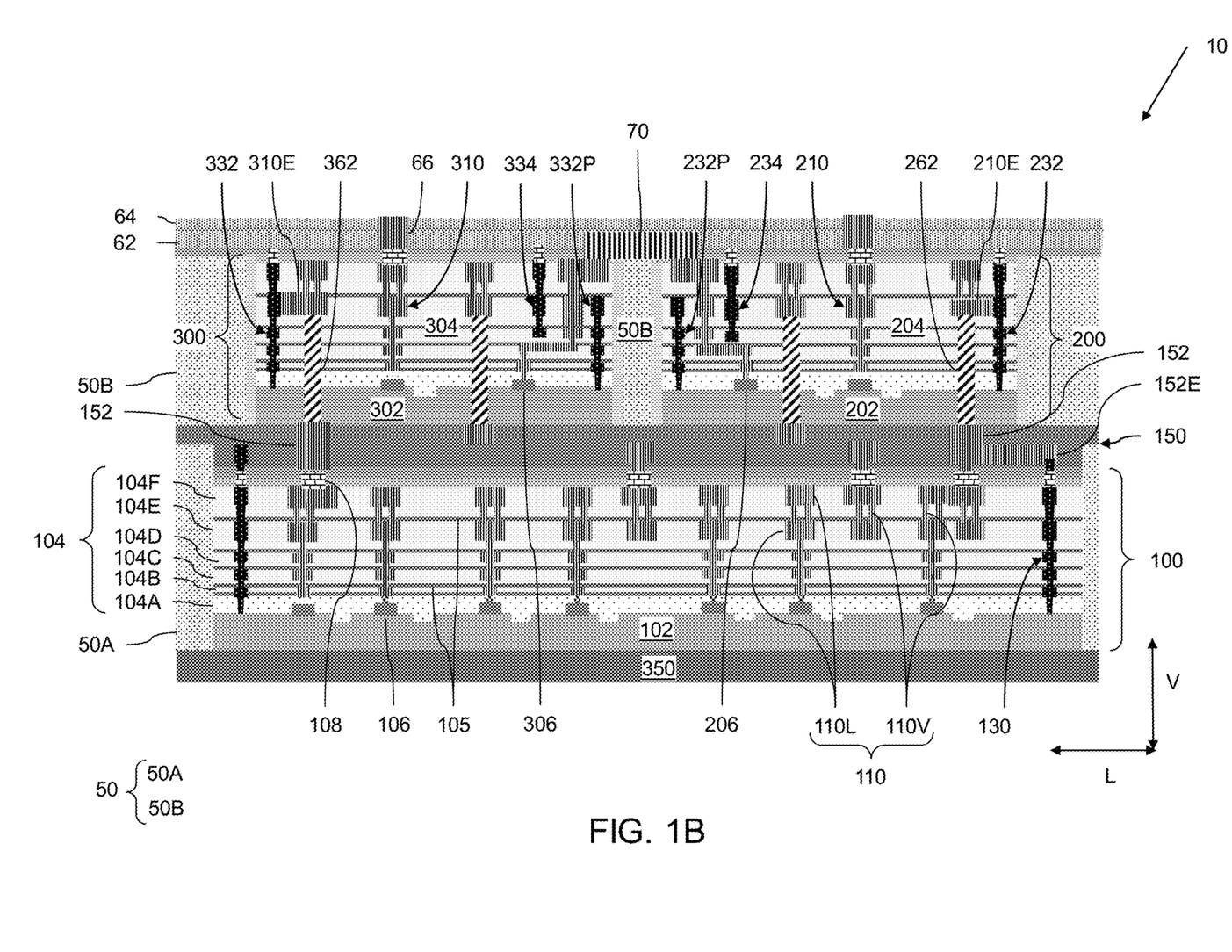
FIG. 1B is a cross-sectional view taken along line I-I' of FIG. 1A.
Figure 1C:
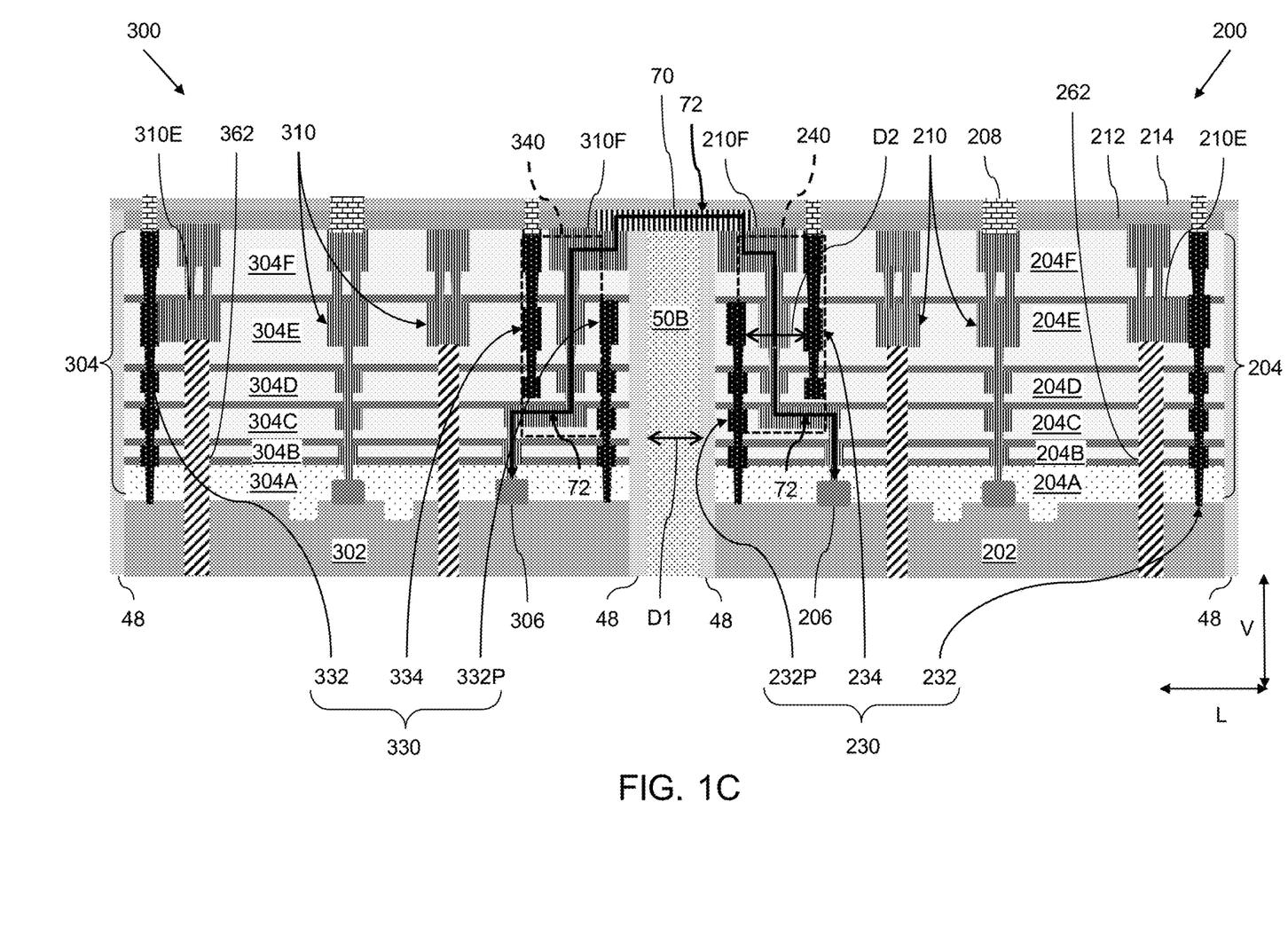
FIG. 1C is an enlarged view showing a second die and a third die of FIG. 1B.

FIG. 1A is a simplified top view of an exemplary semiconductor package 10, according to various embodiments of the present disclosure. FIG. 1B is a cross-sectional view taken along line I-I' of FIG. 1A. FIG. 1C is an enlarged view showing a second die and a third die of FIG. 1B.

Referring to FIGS. 1A-1C, the semiconductor package 10 includes a first die 100, a second die 200, and a third die 300. However, in some embodiments, the semiconductor package 10 may include additional dies disposed on the first die 100 and/or on the second die 200 and/or the third die 300. The second die 200 and the third die 300 may be disposed side-by-side and bonded to the same side of the first die 100. For example, as shown in FIG. 1B, the second die 200 and the third die 300 may be disposed on the front side of the first die 100 and bonded in a face-to-back configuration. However, in other embodiments, the second die 200 and the third die 300 may be disposed on the backside of the first die 100, and/or may be bonded to the first die 100 in a face-to-face configuration.

The first die 100, the second die 200, and third die 300 may each be independently selected from, for example, an application-specific integrated circuit (ASIC) chip, an analog chip, a sensor chip, a wireless and radio frequency chip, a voltage regulator chip or a memory chip. Other functional chips/dies are within the contemplated scope of disclosure. In some embodiments, the first die 100, the second die 200, and third die 300 may each be an active component or a passive component. In some embodiments, the second die 200 and the third die 300 may have the same function. In other embodiments the second die 200 and the third die 300 may have different functions.

In some embodiments, the size of second die 200 and the size of the third die 300 may be smaller than the size of the first die 100. Herein, the term "size" may refer to the length, width and/or area. For example, as shown in the top view of FIG. 1A, the size (e.g., area or footprint) of the second die 200 and the third die 300 may be less than the size of the first die 100. However, in other embodiments, the combined size of the second die 200 and the third die 300 may be greater than the size of the first die 100.

In various embodiments, the first die 100 includes a first semiconductor substrate 102, a first dielectric structure 104, and a first interconnect structure 110 (including metal lines 110L and vias 110V) and a first seal ring 130 embedded within the first dielectric structure 104.

In some embodiments, the first semiconductor substrate 102 may include an elementary semiconductor such as silicon or germanium and/or a compound semiconductor such as silicon germanium, silicon carbide, gallium arsenic, indium arsenide, gallium nitride or indium phosphide. In some embodiments, the first semiconductor substrate 102 may be a semiconductor-on-insulator (SOI) substrate. In various embodiments, the first semiconductor substrate 102 may take the form of a planar substrate, a substrate with multiple fins, nanowires, or other forms known to people having ordinary skill in the art. Depending on the requirements of design, the first semiconductor substrate 102 may be a P-type substrate or an N-type substrate and may have doped regions therein. The doped regions may be configured for an N-type device or a P-type device.

In some embodiments, a front surface of the first semiconductor substrate 102 may include isolation structures defining at least one active area, and a first device layer may be disposed on/in the active area. The first device layer may include a variety of devices. In some embodiments, the devices may include active components, passive components, or a combination thereof. In some embodiments, the devices may include integrated circuits devices. The devices may be, for example, transistors, capacitors, resistors, diodes, photodiodes, fuse devices, or other similar devices. In some embodiments, the first device layer includes a gate structure, source/drain regions, spacers, and the like.

The first dielectric structure 104 may be disposed on the face (e.g., front side) of the first semiconductor substrate 102. In some embodiments, the first dielectric structure 104 may include one or more layers of silicon oxide, silicon oxynitride, silicon nitride, a low dielectric constant or low-k (LK) or an extreme low dielectric constant or extreme low-k (ELK) material, such as an oxide, porous $SiO_2$, borophosphosilicate glass (BPSG), tetra-ethyl-ortho-silicate (TEOS), spun-on-glass (SOG), undoped silicate glass (USG), fluorinated silicate glass (FSG), high-density plasma (HDP) oxide, or plasma-enhanced TEOS (PETEOS), or a combination thereof. Other suitable dielectric materials may be within the contemplated scope of disclosure. The first dielectric structure 104 may be a single layer or a multiple-layer dielectric structure.

For example, as shown in FIG. 1B, the first dielectric structure 104 may include multiple dielectric layers 104A-104F, which may include a substrate oxide layer 104A, and inter-layer dielectric (ILD) layers 104B-104F. The first dielectric structure 104 may also include etch stop layers 105 disposed between the dielectric layers 104A-104F. The etch stop layers 105 may be formed of a material such as SiN, SiC, TEOS, combinations thereof, or the like. Other suitable etch stop materials are within the contemplated scope of disclosure.

The first dielectric structure 104 may be formed by any suitable deposition process. Herein, "suitable deposition processes" may include a chemical vapor deposition (CVD) process, a physical vapor deposition (PVD) process, an atomic layer deposition (ALD) process, a high density plasma CVD (HDPCVD) process, a metalorganic CVD (MOCVD) process, a plasma enhanced CVD (PECVD) process, a sputtering process, laser ablation, or the like.

A first interconnect structure 110 may be formed within the first dielectric structure 104. The first interconnect structure 110 may include metal features, such as metal lines and via structures disposed in the first dielectric structure 104. The first interconnect structure 110 may be formed of any suitable electrically conductive material, such as tungsten (W), copper (Cu), a copper alloy, aluminum (Al), an aluminum alloy, combinations thereof, or the like. Other suitable metal materials are within the contemplated scope of disclosure.

In some embodiments, barrier layers (not shown) may be disposed between the first interconnect structure 110 and the dielectric layers 104A-104F. The barrier layers may be configured to prevent the intrusion of water vapor into the dielectric structure 104 during processing, and/or to prevent the material of the first interconnect structure 110 from migrating to the first semiconductor substrate 102. The barrier layer may include Ta, TaN, Ti, TiN, CoW, or combinations thereof, for example. Other suitable barrier layer materials may be within the contemplated scope of disclosure.

The first interconnect structure 110 may be electrically connected to substrate pads 106 disposed on the first semiconductor substrate 102, such that the first interconnect structure 110 may electrically interconnect connect semiconductor devices formed on the first semiconductor substrate 102. The first interconnect structure 110 may be electrically connected to interconnect pads 108 disposed on the dielectric structure 104, to electrically connect the first interconnect structure 110 to other dies and/or devices.

The first seal ring 130 may extend around the periphery of the first die 100. For example, the first seal ring 130 may be disposed in the first dielectric structure 104 and may surround the first interconnect structure 110 in a lateral direction L. Herein, the lateral direction L may be a direction parallel to a plane of the first semiconductor substrate 102. The lateral direction L may be perpendicular to a vertical direction V, (e.g., a sticking direction of the second die 200 and the third die 300 on the first die 100). The first seal ring 130 may be configured to protect the first interconnect structure 110 from contaminant diffusion and/or physical damage during device processing, such as plasma etching and/or deposition processes.

The first seal ring 130 may be formed of Cu, TaN, Al, TiW, combinations thereof, or the like. In some embodiments, the first seal ring 130 may include copper at an atomic percentage greater than 80%, such as greater than 90% and/or greater than 95% although greater or lesser percentages may be used. The first seal ring 130 may include conductive lines and via structures that are connected to each other, and may be formed simultaneously with respective first metal features of the first interconnect structure 110 in the respective layers of the first dielectric structure 104.

The first seal ring 130 may be electrically isolated from the first interconnect structure 110.

In some embodiments, the first interconnect structure 110 and/or the first seal ring 130 may be formed by a dual-Damascene process or by multiple single Damascene processes. Single-Damascene processes generally form and fill a single feature with copper per Damascene stage. Dual-Damascene processes generally form and fill two features with copper at once, e.g., a trench and overlapping through-hole may both be filled with a single copper deposition using dual-Damascene processes. In alternative embodiments, the first interconnect structure 110 and/or the first seal ring 130 may be formed by an electroplating process.

For example, the Damascene processes may include patterning a layer of the first dielectric structure 104 to form openings, such as trenches and/or though-holes (e.g., via holes). A deposition process may be performed to deposit a conductive metal (e.g., copper) in the openings. A planarization process, such as chemical-mechanical planarization (CMP) may then be performed to remove excess copper (e.g., overburden) that is disposed on top of the first dielectric structure 104.

In particular, the patterning, metal deposition, and planarizing processes may be performed for each of the dielectric layers of the first dielectric structure 104, in order to form the first interconnect structure 110 and/or the first seal ring 130. For example, an ILD layer 104B may be deposited and patterned to form openings. A deposition process may then be performed to fill the openings in the ILD layer 104B. A planarization process may then be performed to remove the overburden and form metal features of the first interconnect structure 110 in the ILD layer 104B. These process steps may be repeated to form additional ILD layers 104C-104F and the corresponding metal features of the first interconnect structure 110, and thereby complete the first interconnect structure 110 and/or first seal ring 130.

The first die 100 may be disposed on a carrier bonding layer 350. The carrier bonding layer 350 may remain on the first semiconductor substrate 102 after removing a carrier substrate (not shown), such as a carrier wafer, used to support the first die 100 during manufacturing.

The first die 100 may be bonded to the second die 200 and the third die 300 by a die bonding structure 150 including die bonding pads 152. As such, the second die 200 and the third die 300 may be disposed side-by-side on the first die 100. The die bonding structure 150 may be formed by a hybrid bonding process that includes a metal-to-metal bonding and a dielectric-to-dielectric bonding. The die bonding pads 152 may be electrically conductive features formed of the same materials as the first interconnect structure 110. For example, the die bonding pads 152 may include tungsten (W), copper (Cu), a copper alloy, aluminum (Al), an aluminum alloy, a combination thereof, or the like. The die bonding pads 152 may be formed by a dual-Damascene process, or by one or more single-Damascene processes, as described above. In alternative embodiments, the die bonding pads 152 may be formed by an electroplating process. The die bonding pads 152 may be configured to electrically connect the first die 100 to the second die 200 and the third die 300. In particular, at least one die bonding pad 152 may be electrically connected to the first interconnect structure 110.

In some embodiments, a side protection layer 48 may be disposed on side surfaces of the second die 200 and the third die 300. The side protection layer 48 may be formed of a water-impermeable dielectric material, such as silicon oxide, silicon oxynitride, silicon nitride, combinations thereof, or the like.

The semiconductor package 10 may include a dielectric encapsulation (DE) structure 50 that includes a first DE layer 50A that surrounds the first die 100 and a second DE layer 50B that surrounds the second die 200 and the third die 300. The second DE layer 50B may be disposed on the side protection layer 48, in various embodiments. In some embodiments, the DE structure 50 includes a molding compound. The molding compound may include a resin and a filler. In alternative embodiments, the DE structure 50 may include silicon oxide, silicon nitride, a combination thereof, or the like. The DE structure 50 may be formed by spin-coating, lamination, deposition or the like.

The semiconductor package 10 may also include a passivation layer 62, a planarization layer 64, and external bonding pads 66. The passivation layer 62 may be disposed over the second die 200 and the third die 300. The passivation layer 62 may be formed of formed of a passivation material, such as polyimide, silicon oxide, silicon nitride, benzocyclobutene (BCB) polymer, polyimide (PI), polybenzoxazole (PBO) combinations thereof, or the like. Other suitable passivation materials may be within the contemplated scope of disclosure.

The planarization layer 64 may be disposed on the passivation layer 62. The planarization layer 64 may be formed of formed of a material that is water resistant, resistant to stress, has a high step coverage and is uniform. For example, the planarization layer 64 may be formed of polyimides, resins, low-viscosity liquid epoxies, or spin-on glass (SOG) materials. Other suitable planarization materials may be within the contemplated scope of disclosure.

The external bonding pads 66 may extend through the passivation layer 62 and the planarization layer 64 and may be configured to electrically connect the second die 200 and the third die 300 to external devices.

In some embodiments, the second die 200 may include similar components as described with respect to the first die 100. For example, the second die 200 may include a second semiconductor substrate 202, a second dielectric structure 204 including dielectric layers 204A-204F, a second interconnect structure 210 embedded within the second dielectric structure 204. Thus, the differences between the second die 200 and the first die 100 are discussed in detail below.

The second dielectric structure 204 may be disposed over a front side of the second semiconductor substrate 202. The second dielectric structure 204 may have a single-layer or multi-layer structure. For example, as shown in FIG. 1C, the second dielectric structure 204 may include multiple dielectric layers, such as a substrate oxide layer 204A, and inter-layer dielectric (ILD) layers 204B-204F. In some embodiments, the second dielectric structure 204 may include silicon oxide, silicon oxynitride, silicon nitride, a low dielectric constant (low-k) material, or a combination thereof. Other suitable dielectric materials may be within the contemplated scope of disclosure.

In some embodiments, the second die 200 may include a passivation layer 212 disposed on a top surface of the second dielectric structure 204, and a planarization layer 214 disposed on the passivation layer 212. The passivation layer 212 may be formed of a passivation material, such as polyimide, silicon oxide, silicon nitride, benzocyclobutene (BCB) polymer, polyimide (PI), polybenzoxazole (PBO) combinations thereof, or the like. Other suitable passivation materials may be within the contemplated scope of disclosure.

The planarization layer 214 may be formed of formed of a material that is water resistant, resistant to stress, has a high step coverage and is uniform. For example, the planarization layer 214 may be formed of polyimides, resins, low-viscosity liquid epoxies, or spin-on glass (SOG) materials. Other suitable planarization materials may be within the contemplated scope of disclosure.

The second interconnect structure 210 may be formed in the second dielectric structure 204. Specifically, the second interconnect structure 210 may be overlapped with and electrically connected to an integrated circuit region of the second semiconductor substrate 202. In some embodiments, the second interconnect structure 210 includes second metal features, such as metal lines and via structures. The second interconnect structure 210 may be electrically connected to substrate pads 206 disposed on the second semiconductor substrate 202, such that the second interconnect structure 210 may electrically connect semiconductor devices formed on the second semiconductor substrate 202. The second interconnect structure 210 may also be electrically connected to interconnect pads 208 disposed on the second dielectric structure 204, to electrically connect the second interconnect structure 210 to other dies and/or devices.

The second die 200, may also include second through-silicon via (TSV) structures 262 that are electrically connected to the second interconnect structure 210. The second TSV structures 262 may extend through one or more of the dielectric layers of the second dielectric structure 204 and the second semiconductor substrate 202. The second TSV structures 262 may electrically contact the die bonding pads 152, to electrically connect the first die 100 and the second die 200.

The third die 300 may be similar to the second die 200. For example, the third die 300 may include a third semiconductor substrate 302, a third dielectric structure 304 comprising dielectric layers 304A-304F, a third interconnect structure 310, and third TSV structures 362. As such, the components of the third die 300 are not discussed in detail.
Neighboring Die Connection and Sealing Structure Conventionally, in a semiconductor package including second and third dies stacked side-by-side on a first die, the second and third dies are electrically connected via the first die. As such, signals passed between the second and third dies must travel a relatively long distance, which increases circuit resistance.

Referring again to FIGS. 1A-1C, the second die 200 may be electrically connected to the first die 100 by the second TSV structures 262, and the third die 300 may be electrically connected to the first die 100 by the third TSV structures 362. A minimum distance D1 between the second die 200 and the third die 300 may be greater than 1 micron, such as a distance ranging from 1.25 microns to 20 microns, in order to prevent and/or reduce a die-to-die capacitance effect.

The semiconductor package 10 may also include a die connection line 70 that extends laterally between the second die 200 and the third die 300, to electrically connect the second interconnect structure 210 directly to the third interconnect structure 310. The die connection line 70 may be formed of the same material as the second interconnect structure 210 and the third interconnect structure 310. For example, the die connection line 70 may be formed of copper or a copper alloy, and may include copper at an atomic percentage greater than 80%, such as greater than 90% and/or greater than 95%, although greater or lesser percentages of copper may be used.

Accordingly, as shown in FIG. 1C, a connection circuit 72 may be formed to electrically connect the laterally adjacent second die 200 and third die 300, without extending through the first die 100. In other words, the connection circuit 72 does not include a TSV structure or any metal features of the first interconnect structure 110. For example, the connection circuit 72 may include a portion of the second interconnect structure 210, the die connection line 70, and a portion of the third interconnect structure 310, and may electrically connect a substrate pad 206 of the second semiconductor substrate 202 and a substrate pad 306 of the third semiconductor substrate 302, to electrically connect the second semiconductor substrate 202 and the third semiconductor substrate 302.

Accordingly, the connection circuit 72 may provide a lower resistance electrical connection between the laterally adjacent second die 200 and third die 300, as compared to if the second die 200 and the third die 300 were electrically connected via the first interconnect structure 110, the second TSV structure 262, and the third TSV structure 362.

The second die 200 may include a second seal ring structure 230 in order to protect the second interconnect structure 210 from contamination and/or moisture damage. The second seal ring structure 230 may include a metal material disposed inside of a barrier layer, as discussed above with respect to the first seal ring 130. For example, in some embodiments the second seal ring structure 230 may include copper or a copper alloy comprising at least 90 atomic % copper, disposed inside of a barrier layer comprising a water resistant material such as undoped silicate glass (USG), SiN, or the like.

In various embodiments, the second seal ring structure 230 may include a second seal ring 232 and a second circuit seal 234. The second seal ring 232 may extend in the vertical direction V from the second semiconductor substrate 202, through the second dielectric structure 204, to the passivation layer 212. However, a portion 232P of the second seal ring 232 may have a reduced height in the vertical direction V, in order to provide space for the connection circuit 72 to pass there above. For example, the portion 232P may not extend into one or more uppermost layers dielectric layers of the second dielectric structure 204, such as an uppermost ILD layer 204F. In particular, the portion 232P may be disposed below a metal line 210F disposed the uppermost ILD layer 204F of the second interconnect structure 210, which may be included in the connection circuit 72. A minimum distance D2 between the portion 232P and the second circuit seal 234 may be greater that one micron, such as a distance ranging from 1.25 microns to 20 microns, in order to prevent and/or reduce a capacitance effect.

The second circuit seal 234 may extend from two points on the second seal ring 232 and may at least partially surround a portion of the connection circuit 72. For example, the second circuit seal 234 may extend through the second interconnect structure 210, so as to at least partially surround, in the lateral direction L, a portion of the second interconnect structure 210 that is included in the connection circuit 72. The second circuit seal 234 may extend from the passivation layer 212, in the vertical direction V, through the second dielectric structure 204. At least a portion of the second circuit seal 234 may not extend all the way to the second semiconductor substrate 202, in the vertical direction V, in order to provide space for the connection circuit 72 to extend in the lateral direction L to reach the substrate pad 206. For example, the second circuit seal 234 may terminate in the ILD layer 204D, such that the connection circuit 72 may extend in the lateral direction L through ILD layer 204C, under the second circuit seal 234.

Accordingly, the second seal ring structure 230 may include an opening 240 through which the connection circuit 72 extends, due to the top of the portion 232P being disposed below the ILD layer 204E, and the bottom of the second circuit seal 234 being disposed above the ILD layer 204C. In other words, the connection circuit 72 may include a portion of the second interconnect structure 210 that extends through the opening 240, by extending over the second seal ring 232, between the second seal ring 232 and the second circuit seal 234, and under the second circuit seal 234, to contact the substrate pad 206.

Accordingly, the opening 240 may allow the connection circuit 72 to extend through the second seal ring structure 230 in the lateral direction L, which reduces the length and/or resistance of the connection circuit 72, as compared to a connection circuit that extends through the first die 100. In addition, the second seal ring structure 230 and the second interconnect structure 210 may include barrier layers, which may prevent and/or reduce the intrusion of moisture and/or contaminants into the second dielectric structure 204, during manufacturing.

The third die 300 may include a third seal ring structure 330 that is similar to the second seal ring structure 230. In particular, the third seal ring structure 330 may include a third seal ring 332 and a third circuit seal 334. A portion 332P of the third seal ring 332 and the third circuit seal 334 may form an opening 340 through which the connection circuit 72 extends. In particular, the connection circuit 72 may include a portion of the third interconnect structure 310 that extends from the die connection line 70, over the third seal ring 332, between the third seal ring 332 and the third circuit seal 334, and then under the third circuit seal 334 to contact the substrate pad 306. A portion 332P of the third seal ring 332 may extend into the ILD layer 304E, and may be disposed below a metal line 310F of the third interconnect structure 310 that is disposed in an uppermost ILD layer 304F.

The second interconnect structure 210 may include a metal line 210E that electrically connects the second seal ring structure 230 to one of the second TSV structures 262. In particular, the metal line 210E may electrically connect the second seal ring 232 to the second TSV structure 262, and may be disposed in the ILD layer 204E. The second TSV structure 262 may be electrically connected to the first semiconductor substrate 102, via the first interconnect structure 110 and one of the die bonding pads 152. As such, the second seal ring structure 230 may be electrically grounded to the first semiconductor substrate 102.

One of the die bonding pads 152 may include a pad extension 152E that electrically connects the die bonding pad 152 to the first seal ring 130. Accordingly, the first seal ring 130 may also be electrically grounded to the first semiconductor substrate 102.

The third interconnect structure 310 may include a metal line 310E that electrically connects the third seal ring structure 330 with one of the third TSV structures 362. In particular, the metal line 310E may electrically connect the third seal ring 332 to the third TSV structure 362. The third TSV structure 362 may be electrically connected to the first interconnect structure 110 by one of the die bonding pads 152, such that the third seal ring structure 330 may be electrically grounded to the first semiconductor substrate 102 via the first interconnect structure 110.

In various embodiments, lower ILD layers 204B-204C and 304B-304C may be formed of a low-k material and upper ILD layers 204D-204F and 304D-304F may be formed of a dielectric material having a higher water resistance, such as silicon nitride, undoped silicate glass, or the like. Accordingly, the upper ILD layers 204D-204F and 304D-304F may be respectively configured to prevent the intrusion through the opening 240 and the opening 340.

As shown in FIGS. 1A-1C, the second die 200 and the third die 300 may include similar seal ring structures (e.g., the second seal ring structure 230 and the third seal ring structure 330). However, the present disclosure is not limited to dies including similar seal ring structures. For example, the second die 200 and the third die 300 may include seal ring structures that have different features, or one or both of the second die 200 and the third die 300 may include seal ring structures having additional sealing features.

Figure 2A:
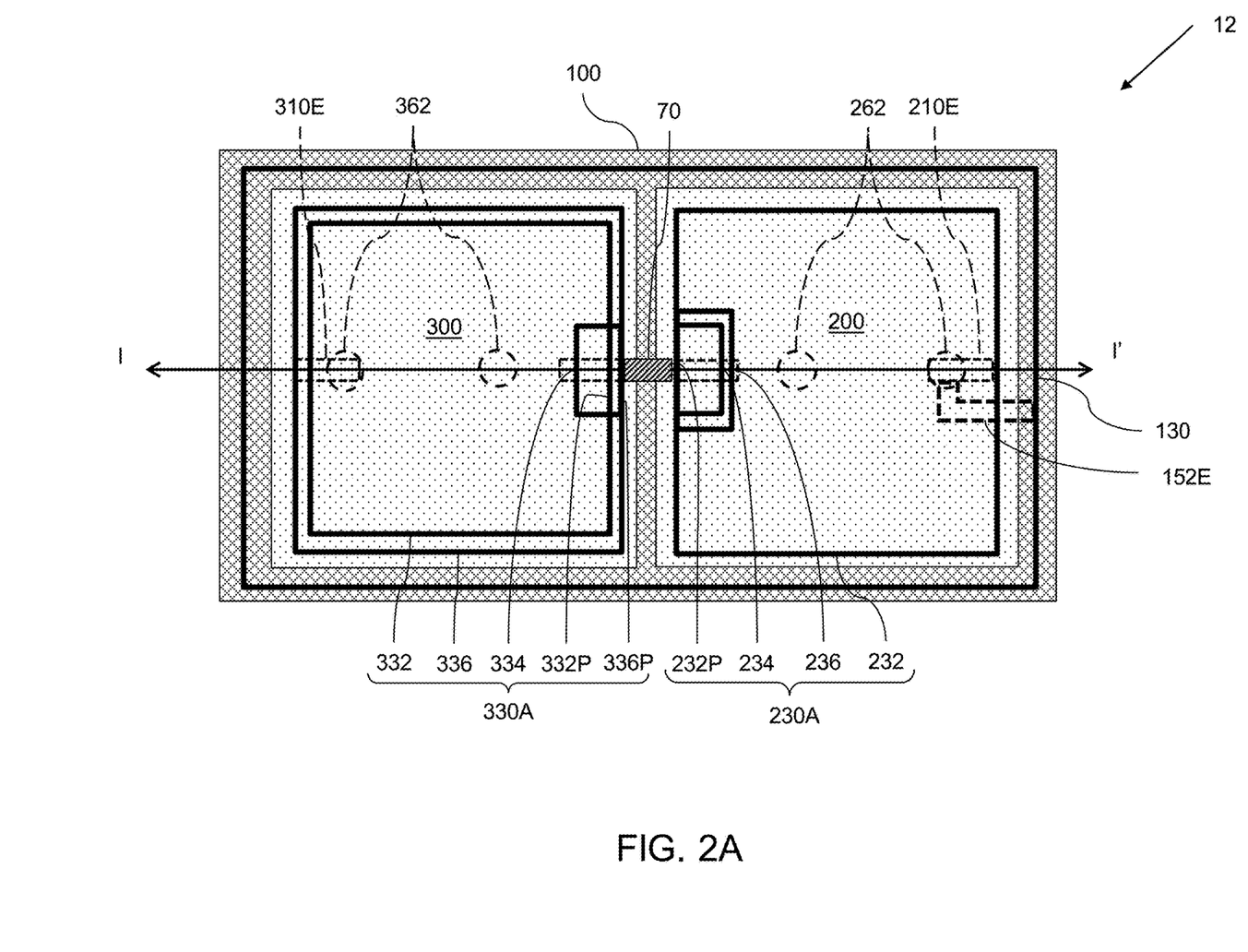
FIG. 2A is a simplified top view of an exemplary semiconductor package including a modified second seal ring structure and a modified third seal ring structure 330A, according to various embodiments of the present disclosure.
Figure 2B:
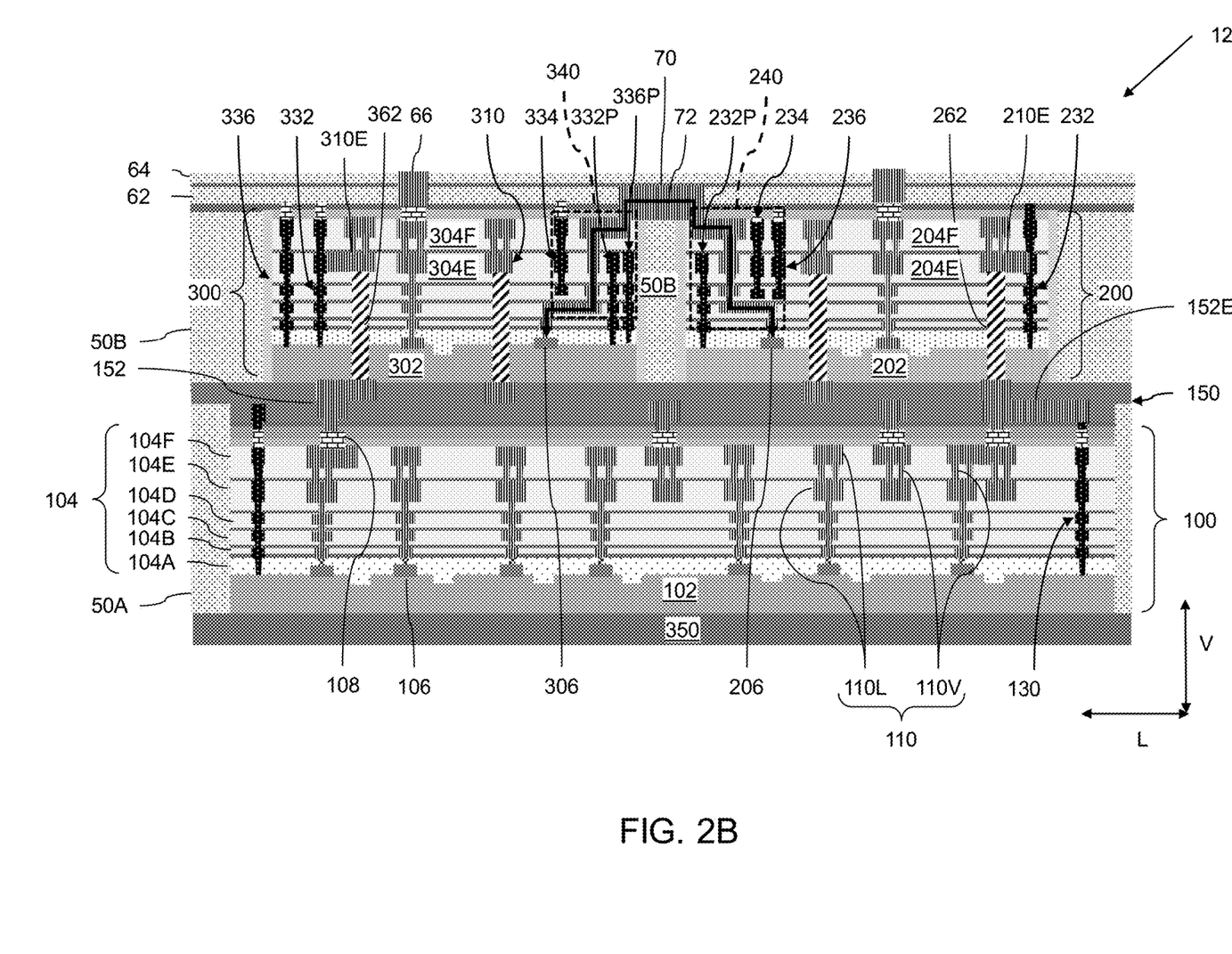
FIG. 2B is a cross-sectional view taken along line I-I' of FIG. 2A.

For example, FIG. 2A is a simplified top view of an exemplary semiconductor package 12 including a modified second seal ring structure 230A and a modified third seal ring structure 330A, according to various embodiments of the present disclosure. FIG. 2B is a cross-sectional view taken along line I-I' of FIG. 2A. Referring to FIGS. 2A and 2B, the semiconductor package 12 may be similar to the semiconductor package 10, except for the modified second seal ring structure 230A and third seal ring structure 330A. Accordingly, only the differences there between will be discussed in detail, and like reference numbers refer to like elements.

The second seal ring structure 230A may include a second seal ring 232, an inner second circuit seal 234, and an outer second circuit seal 236. The inner second circuit seal 234 and the outer second circuit seal 236 may each extend from the second seal ring 232, and may respectively at least partially surround a portion of the connection circuit 72. A portion 232P of the second seal ring 232, the inner second circuit seal 234, and the outer second circuit seal 236 may be configured to provide an opening 240 for metal lines and via structures of the second interconnect structure 210 to extend from the substrate pad 206 to the die connection line 70, such that the connection circuit 72 may be electrically connected to the second semiconductor substrate 202.

The third seal ring structure 330A may include a third seal ring 332, a fourth seal ring 336, and a third circuit seal 334. The third seal ring 332 and the fourth seal ring 336 may extend around the perimeter of the third die 300, with the fourth seal ring 336 surrounding the third seal ring 332. A portion 332P of the third seal ring 332 and a portion 336P of the fourth seal ring 336 may have a reduced height, such that the portion 332P and the portion 336P do not extend above ILD layer 304E, in the vertical direction V, in order to provide space for the connection circuit 72 (e.g., metal line 310F) to pass there above.

The third interconnect structure 310 may include a metal line 310E that electrically connects the third seal ring 332 to a third TSV structure 362, such that the third seal ring structure 330A may be electrically grounded to the first semiconductor substrate 102, via the one of the die bonding pads 152 and the first interconnect structure 110.

In some embodiments, the third die 300 may include the second seal ring structure 230A in place of the third seal ring structure 330A, such that both the second die 200 and the third die 300 include similar seal ring structures. In other embodiments, the second die 200 may include the third seal ring structure 330A, in place of the second seal ring structure 230A, such that both the second die 200 and the third die 300 include similar seal ring structures. In still other embodiments, the second seal ring structure 230A may be replaced with the second seal ring structure 230, and/or the third seal ring structure 330A may be replaced with the third seal ring structure 330. Accordingly, the present disclosure is not limited to any particular seal ring structures, or combination thereof.

Figure 3:
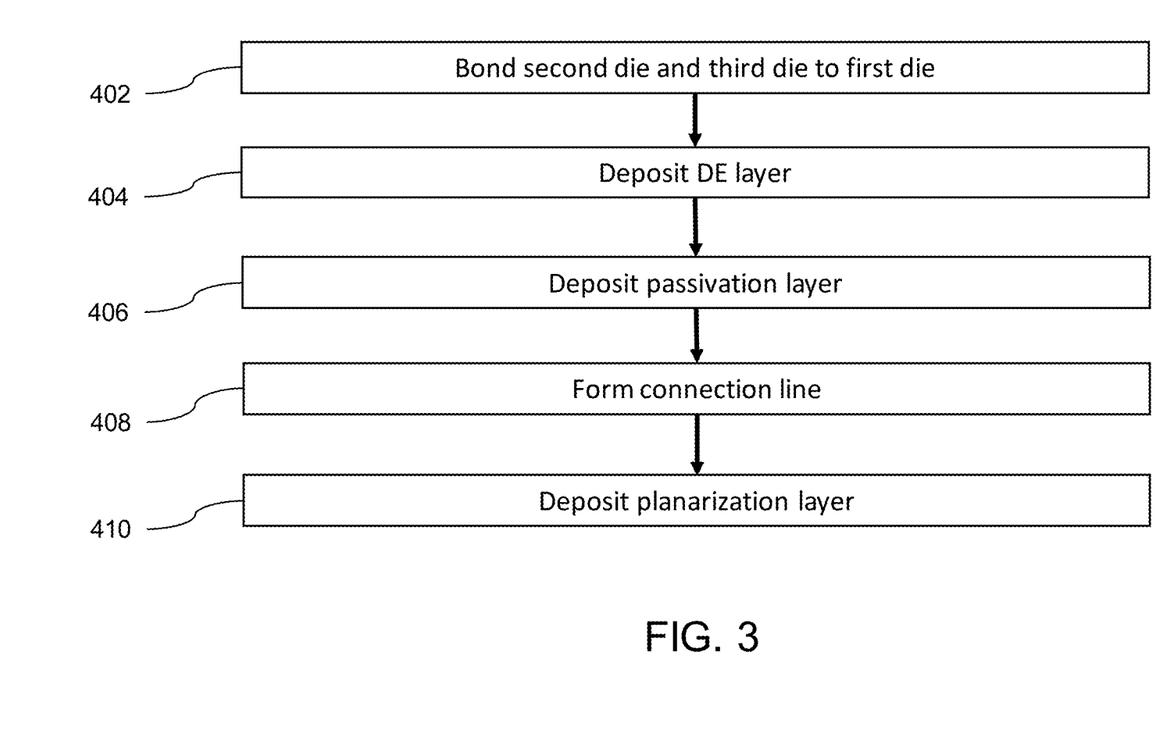
FIG. 3 is a process flow diagram illustrating the operations of a method of forming the semiconductor package 10 of FIGS. 1A-1C, according to various embodiments of the present disclosure.

FIG. 3 is a flow diagram including operations of a method of forming the semiconductor package 10 of FIGS. 1A-1C, according to various embodiments of the present disclosure. Referring to FIGS. 1A-1C and 3, in operation 402 the second die 200 and the third die 300 may be bonded to the first die 100. In particular, bonding layers including metal features may be deposited and fusion bonded to form the bonding structure 150 and the bonding pads 152. In some embodiments, operation 402 may include forming the pad extension 152E that electrically contacts the first seal ring 130.

In operation 404, the second DE layer 50B may be deposited on the bonding structure 150 and surrounding the second die 200 and the third die 300. The second DE layer 50B may be deposited using any suitable deposition process. In some embodiments, operation 404 may include a CMP process, such that the top surface of the second DE layer 50B may be coplanar with the top surface of the second die 200 and the top surface of the third die 300.

In operation 406, the passivation layer 62 may be deposited on the upper surfaces of the second DE layer 50B, the second die 200, and the third die 300. The passivation layer 62 may be formed using any suitable deposition process.

In operation 408, the connection line 70 may be formed to electrically connect the second interconnect structure 210 and the third interconnect structure 310. The connection line 70 may be formed using any suitable metal deposition process. Operation 408 may also include forming a first portion of the external bonding pads 66, using any suitable metal deposition process.

In operation 410, a planarization layer 64 may be deposited on the passivation layer 62 and the connection line 70. The planarization layer 64 may be formed using any suitable deposition process. In some embodiments, operation 410 may include forming a second portion of the external bonding pads 66.

In various embodiments, the passivation layer 62, the planarization layer 64, the external bonding pads 66, and the connection line 70 may be formed using a dual-Damascene process or multiple single Damascene processes.

Various embodiments provide a semiconductor package 10, 12 that may include: a first die 100; a second die 200 stacked on an upper surface of the first die 100, the second die 200 may include a second semiconductor substrate 202 and a second seal ring structure 230, 230A that extends along a perimeter of the second semiconductor substrate 202; a third die 300 stacked on the upper surface of the first die 100, the third die 300 may include a third semiconductor substrate 302 and a third seal ring structure 330, 330A that extends along a perimeter of the third semiconductor substrate 302; and a connection circuit 72 that extends through the second seal ring structure 230, 230A and the third seal ring structure 330, 330A, in a lateral direction perpendicular to the stacking direction of the first die 100 and the second die 200, to electrically connect the second semiconductor substrate 202 and the third semiconductor substrate 302.

In one embodiment, the connection circuit 72 may include a connection line 70 that extends from an upper surface of the second die 200 to an upper surface of the third die 300. In one embodiment, the second die may include a second interconnect structure 210 and a second dielectric structure 204 in which the second interconnect structure 210 and the second seal ring structure 230, 230A may be disposed; the third die 300 may include a third interconnect structure 310 and a third dielectric structure 304 in which the third interconnect structure 310 and the third seal ring structure 330, 330A may be disposed; and the connection circuit 72 may include a portion of the second interconnect structure 210 that extends through the second seal ring structure 230, 230A and contacts the connection line 70 and a portion of the third interconnect structure 310 that extends through the third seal ring structure 330, 330A and contacts the connection line 70. In one embodiment, the second seal ring structure 230, 230A may include: a second seal ring 232 that surrounds the second interconnect structure 210; and a second circuit seal 234 that extends from the second seal ring 232, around the portion of the second interconnect structure 210 and back to the second seal ring 232. In one embodiment, the portion of the second interconnect structure 210 extends under the second circuit seal 234, between the second circuit seal 234 and the second seal ring 232, and over the second seal ring 232P, to electrically connect the connection line 70 and the second semiconductor substrate 202. In one embodiment, the third seal ring structure 330 may include: a third seal ring 332 that surrounds the third interconnect structure 310; and a third circuit seal 334 that extends from the third seal ring 332, around the portion of the third interconnect structure 310, and back to the third seal ring 332. In one embodiment, the portion of the third interconnect structure 310 extends under the third circuit seal 334, between the third circuit seal 334 and the third seal ring 332, and over the third seal ring 332, to electrically connect the connection line 70 and the third semiconductor substrate 302. In one embodiment, the semiconductor package may further include barrier layers disposed around the second interconnect structure 210, the third interconnect structure 310, the second seal ring structure 230, 230A, and the third seal ring structure 330, 330A. In one embodiment, the second seal ring structure 230, 230A may be electrically grounded to a first semiconductor substrate 102 of the first die 100. In one embodiment, the second die 200 comprises a second through-substrate via (TSV) structure 262 that may extend through the second semiconductor substrate 202 and that may electrically connect the second seal ring structure 230, 230A to the first die 100. In one embodiment, the TSV 262 may be electrically connected to a first interconnect structure 110 disposed on a first semiconductor substrate 102 of the first die 100, by a die bonding pad 152; and a first seal ring 130 of the first die 100 may be electrically connected to the bonding pad 152 by a pad extension 152E, such that the second seal ring structure 230, 230A and the first seal ring 130 may be both electrically grounded to the first semiconductor substrate 102 by the first interconnect structure 110. In one embodiment, the connection line 70 may be disposed in a passivation layer 62 that covers the upper surface of the second die 200 and the upper surface of the third die 300. In one embodiment, the second semiconductor die 200 and the third semiconductor die 300 may be separated by a minimum distance of at least one micron.

Various embodiments provide a semiconductor package 10, 12 that may include: a first die 100; a second die 200 stacked on an upper surface of the first die 100, the second die 200 may include a second semiconductor substrate 202, a second dielectric structure 204 disposed on the second semiconductor substrate 202, a second interconnect structure 210 disposed in the second dielectric structure 204, and a second seal ring structure 230, 230A disposed in the second dielectric structure 204; a third die 300 stacked on the upper surface of the first die 100 and separated from the second die 200 in a lateral direction perpendicular to the vertical direction, the third die 300 may include a third semiconductor substrate 302, a third dielectric structure 304 disposed on the third semiconductor substrate 302, a third interconnect structure 310 disposed in the third dielectric structure 304, and a third seal ring structure 330, 330A disposed in the third dielectric structure 304; and a die connection line 70 extending from an upper surface of the second die 200 to an upper surface of the third die 300 to electrically connect a portion of the second interconnect structure 210 that extends through the second seal ring structure 230, 230A, in the lateral direction, to a portion of the third interconnect structure 310 that extends through the third seal ring structure 330, 330A, in the lateral direction.

In one embodiment, the second seal ring structure 230, 230A may include: a second seal ring 232 that at least partially surrounds the second interconnect structure 210; an inner second circuit seal 234 that extends from the second seal ring 232, around a portion of the second interconnect structure 210, and back to the second seal ring 232; and an outer second circuit seal 236 that extends from the second seal ring 232, around the inner second circuit seal 234, and back to the second seal ring 232. In one embodiment, the third seal ring structure 330, 330A may include: a third seal ring 332 that at least partially surrounds the third interconnect structure 310; a third circuit seal 334 that extends from the third seal ring 332, around a portion of the third interconnect structure 310, and back to the third seal ring 332; and a fourth seal ring 336 that extends around the third seal ring 332. In one embodiment, the portion of the second interconnect structure 210 extends under the outer second circuit seal 236, between the inner second circuit seal 234 and the second seal ring 232, and over the second seal ring 232, to electrically connect the second semiconductor substrate 202 and the die connection line 70; and the portion of the third interconnect structure 310 extends under the third circuit seal 334, between the third circuit seal 334 and the third seal ring 332, and over the third seal ring 332 and the fourth seal ring 336, to electrically connect the third semiconductor substrate 302 and the die connection line 70. In one embodiment, the inner second circuit seal 234 and the outer second circuit seal 236 may be separated by a minimum distance of greater than one micron; and the third seal ring 332 and the fourth seal ring 336 may be separated by a minimum distance of greater than one micron. In one embodiment, the second die 200 may include a second through-substrate via (TSV) structure 262 that may extend through the second semiconductor substrate 202 and that may electrically connect the second seal ring structure 230, 230A to the first die 100; and the third die 300 may include a third through-substrate via (TSV) structure 362 that may extend through the third semiconductor substrate 302 and that may electrically connect the third seal ring structure 330, 330A to the first die 100.

Various embodiments provide a semiconductor package 10, 12 that may include: a first die 100; a second die 200 stacked on an upper surface of the first die 100, the second die 200 comprising a second semiconductor substrate 202, a second interconnect structure 210 disposed on an upper surface of the second semiconductor substrate 202, a second seal ring 232 that surrounds the second interconnect structure 210, and a second circuit seal 234 that extends from the second seal ring 232, around the portion of the second interconnect structure 210, and back to the second seal ring 232; a third die 300 stacked on the upper surface of the first die 100, the third die 300 comprising a third semiconductor substrate 302, a third interconnect structure 310 disposed on an upper surface of the third semiconductor substrate 302, a third seal ring 332 that surrounds the third interconnect structure 310, and a third circuit seal 334 that extends from the third seal ring 332, around a portion of the third interconnect structure 310, and back to the third seal ring 332; and a connection line that electrically connects the portion of the second interconnect structure 210 with the portion of the third interconnect structure 310.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package comprising:
    a first die;
    a second die stacked on an upper surface of the first die, the second die comprising a second semiconductor substrate and a second seal ring structure that extends along a perimeter of the second semiconductor substrate;
    a third die stacked on the upper surface of the first die, the third die comprising a third semiconductor substrate and a third seal ring structure that extends along a perimeter of the third semiconductor substrate; and
    a connection circuit that extends through the second seal ring structure and the third seal ring structure, in a lateral direction perpendicular to a stacking direction of the first die and the second die, to electrically connect the second semiconductor substrate and the third semiconductor substrate.

2. The semiconductor package of claim 1, wherein the connection circuit comprises a connection line that extends from an upper surface of the second die to an upper surface of the third die.

3. The semiconductor package of claim 2, wherein:
    the second die comprises a second interconnect structure and a second dielectric structure in which the second interconnect structure and the second seal ring structure are disposed;
    the third die comprises a third interconnect structure and a third dielectric structure in which the third interconnect structure and the third seal ring structure are disposed; and
    the connection circuit comprises a portion of the second interconnect structure that extends through the second seal ring structure and contacts the connection line and a portion of the third interconnect structure that extends through the third seal ring structure and contacts the connection line.

4. The semiconductor package of claim 3, wherein the second seal ring structure comprises:
    a second seal ring that surrounds the second interconnect structure; and
    a second circuit seal that extends from the second seal ring, around the portion of the second interconnect structure, and back to the second seal ring.

5. The semiconductor package of claim 4, wherein the portion of the second interconnect structure extends under the second circuit seal, between the second circuit seal and the second seal ring, and over the second seal ring, to electrically connect the connection line and the second semiconductor substrate.

6. The semiconductor package of claim 4, wherein the third seal ring structure comprises:
a third seal ring that surrounds the third interconnect structure; and
a third circuit seal that extends from the third seal ring, around the portion of the third interconnect structure, and back to the third seal ring.

7. The semiconductor package of claim 6, wherein the portion of the third interconnect structure extends under the third circuit seal, between the third circuit seal and the third seal ring, and over the third seal ring, to electrically connect the connection line and the third semiconductor substrate.

8. The semiconductor package of claim 4, further comprising barrier layers disposed around the second interconnect structure, the third interconnect structure, the second seal ring structure, and the third seal ring structure.

9. The semiconductor package of claim 4, wherein the second seal ring structure is electrically grounded to a first semiconductor substrate of the first die.

10. The semiconductor package of claim 9, wherein the second die comprises a second through-substrate via (TSV) structure that extends through the second semiconductor substrate and that electrically connects the second seal ring structure to the first die.

11. The semiconductor package of claim 10, wherein:
the TSV is electrically connected to a first interconnect structure disposed on a first semiconductor substrate of the first die, by a die bonding pad; and
a first seal ring of the first die is electrically connected to the bonding pad by a pad extension, such that the second seal ring structure and the first seal ring are both electrically grounded to the first semiconductor substrate by the first interconnect structure.

12. The semiconductor package of claim 1, wherein a connection line is disposed in a passivation layer that covers the upper surface of the second die and the upper surface of the third die.

13. The semiconductor package of claim 1, wherein the second semiconductor die and the third semiconductor die are separated by a minimum distance of at least one micron.

14. A semiconductor package comprising:
a first die;
a second die stacked on an upper surface of the first die, the second die comprising a second semiconductor substrate, a second dielectric structure disposed on the second semiconductor substrate, a second interconnect structure disposed in the second dielectric structure, and a second seal ring structure disposed in the second dielectric structure;
a third die stacked on the upper surface of the first die and separated from the second die in a lateral direction perpendicular to a vertical direction, the third die comprising a third semiconductor substrate, a third dielectric structure disposed on the third semiconductor substrate, a third interconnect structure disposed in the third dielectric structure, and a third seal ring structure disposed in the third dielectric structure; and
a die connection line extending from an upper surface of the second die to an upper surface of the third die to electrically connect a portion of the second interconnect structure that extends through the second seal ring structure, in the lateral direction, to a portion of the third interconnect structure that extends through the third seal ring structure, in the lateral direction.

15. The semiconductor package of claim 14, wherein the second seal ring structure comprises:
a second seal ring that at least partially surrounds the second interconnect structure;
an inner second circuit seal that extends from the second seal ring, around a portion of the second interconnect structure, and back to the second seal ring; and
an outer second circuit seal that extends from the second seal ring, around the inner second circuit seal, and back to the second seal ring.

16. The semiconductor package of claim 15, wherein the third seal ring structure comprises:
a third seal ring that at least partially surrounds the third interconnect structure;
a third circuit seal that extends from the third seal ring, around a portion of the third interconnect structure, and back to the third seal ring; and
a fourth seal ring that extends around the third seal ring.

17. The semiconductor package of claim 16, wherein:
the portion of the second interconnect structure extends under the outer second circuit seal, between the inner second circuit seal and the second seal ring, and over the second seal ring, to electrically connect the second semiconductor substrate and the connection line; and
the portion of the third interconnect structure extends under the third circuit seal, between the third circuit seal and the third seal ring, and over the third seal ring and the fourth seal ring, to electrically connect the third semiconductor substrate and the connection line.

18. The semiconductor package of claim 16, wherein:
the inner second circuit seal and the outer second circuit seal are separated by a minimum distance of greater than one micron; and
the third seal ring and the fourth seal ring are separated by a minimum distance of greater than one micron.

19. The semiconductor package of claim 15, wherein:
the second die comprises a second through-substrate via (TSV) structure that extends through the second semiconductor substrate and that electrically connects the second seal ring structure to the first die; and
the third die comprises a third through-substrate via (TSV) structure that extends through the third semiconductor substrate and that electrically connects the third seal ring structure to the first die.

20. A semiconductor package comprising:
a first die;
a second die stacked on an upper surface of the first die, the second die comprising a second semiconductor substrate, a second interconnect structure disposed on an upper surface of the second semiconductor substrate, a second seal ring that surrounds the second interconnect structure, and a second circuit seal that extends from the second seal ring, around a portion of the second interconnect structure, and back to the second seal ring;
a third die stacked on the upper surface of the first die, the third die comprising a third semiconductor substrate, a third interconnect structure disposed on an upper surface of the third semiconductor substrate, a third seal ring that surrounds the third interconnect structure, and a third circuit seal that extends from the third seal ring, around a portion of the third interconnect structure, and back to the third seal ring; and
a die connection line that electrically connects the portion of the second interconnect structure with the portion of the third interconnect structure.

* * * * *